(12) United States Patent
Kang et al.

(10) Patent No.: US 9,978,813 B2
(45) Date of Patent: May 22, 2018

(54) ORGANIC LIGHT-EMITTING DISPLAY APPARATUS

(71) Applicant: Samsung Display Co., Ltd., Yongin-si, Gyeonggi-do (KR)

(72) Inventors: Kinyeng Kang, Yongin-si (KR); Sunkwang Kim, Yongin-si (KR); Heejun Yoo, Yongin-si (KR); Jonghyun Choi, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 4 days.

(21) Appl. No.: 15/260,068

(22) Filed: Sep. 8, 2016

(65) Prior Publication Data
US 2017/0077188 A1    Mar. 16, 2017

(30) Foreign Application Priority Data

Sep. 11, 2015 (KR) .................. 10-2015-0129088

(51) Int. Cl.
*H01L 27/32* (2006.01)
*H01L 51/56* (2006.01)
*H01L 51/52* (2006.01)

(52) U.S. Cl.
CPC ...... *H01L 27/3211* (2013.01); *H01L 27/3246* (2013.01); *H01L 27/3248* (2013.01);
(Continued)

(58) Field of Classification Search
CPC ............ H01L 27/3211; H01L 27/3248; H01L 27/3246; H01L 27/3279; H01L 51/56;
(Continued)

(56) References Cited

U.S. PATENT DOCUMENTS

| 2011/0169720 A1 | 7/2011 | Hwang et al. |
| 2011/0204369 A1* | 8/2011 | Ha ..................... H01L 51/5228 257/59 |

(Continued)

FOREIGN PATENT DOCUMENTS

| KR | 10-2011-0081629 A | 7/2011 |
| KR | 10-2011-0111104 A | 10/2011 |
| KR | 10-2012-0124224 A | 11/2012 |

*Primary Examiner* — Thanh T Nguyen
(74) *Attorney, Agent, or Firm* — Innovation Counsel, LLP

(57) ABSTRACT

An organic light-emitting display apparatus including: a pixel including a first region realizing an image and a second region through which external light is transmitted, a driving circuit unit disposed in the first region, a wire area including a third region and a fourth region, a wire for transferring a signal to the driving circuit unit, a first electrode disposed in the first region and electrically connected to the driving circuit unit, a pixel defining layer disposed in the first region and including a first opening and a second opening, a second electrode disposed in the first region opposite the first electrode, an organic emission layer disposed between the first electrode and the second electrode, and an insulating structure disposed between the substrate and the pixel defining layer and including at least one insulating layer that includes a third opening corresponding to the second region and the fourth region.

20 Claims, 9 Drawing Sheets

(52) U.S. Cl.
CPC ........ *H01L 27/326* (2013.01); *H01L 27/3279* (2013.01); *H01L 51/5256* (2013.01); *H01L 51/56* (2013.01)

(58) Field of Classification Search
CPC ... H01L 27/32; H01L 27/326; H01L 51/5262; H01L 27/3258
See application file for complete search history.

(56) References Cited

U.S. PATENT DOCUMENTS

| | | |
|---|---|---|
| 2011/0241014 A1 | 10/2011 | Yoon et al. |
| 2012/0280215 A1 | 11/2012 | Choi et al. |
| 2015/0014650 A1 | 1/2015 | Lim et al. |
| 2015/0060792 A1* | 3/2015 | Lee .................... H01L 51/5275 257/40 |

* cited by examiner

ORGANIC LIGHT-EMITTING DISPLAY APPARATUS

CROSS-REFERENCE TO RELATED APPLICATION

This application claims the benefit of Korean Patent Application No. 10-2015-0129088, filed on Sep. 11, 2015, in the Korean Intellectual Property Office, the disclosure of which is incorporated herein in its entirety by reference.

BACKGROUND

1. Field

One or more exemplary embodiments relate to an organic light-emitting display apparatus, and more particularly, to a see-through organic light-emitting display apparatus that enables a user to recognize an external background as well as an image realized by the organic light-emitting display apparatus.

2. Description of the Related Art

An organic light-emitting apparatus is a self-emitting display apparatus that includes an organic light-emitting device including a hole injection electrode, an electron injection electrode, and an organic emission layer formed therebetween. In the organic light-emitting apparatus, holes injected from the hole injection electrode and electrons injected from the electron injection electrode combine in the organic emission layer, thereby generating excitons, and when the excitons decay from an excited state to a ground state, light is emitted.

The organic light-emitting display apparatus does not use a separate light source. Therefore, the organic light-emitting display apparatus is driven with a low voltage and is light and thin. Also, as the organic light-emitting display apparatus has other excellent characteristics, such as a broad viewing angle, high contrast, and short response time, the application range of such an apparatus has been expanded from personal portable devices, such as MP3 players and portable terminals, to televisions (TVs) and so on.

SUMMARY

One or more exemplary embodiments include an organic light-emitting display apparatus.

Additional aspects are set forth in part in the description that follows and, in part, will be apparent from the description, or may be learned by practice of the presented embodiments.

According to one or more exemplary embodiments, an organic light-emitting display apparatus includes: a substrate; a pixel disposed on the substrate, the pixel including a first region configured to realize an image and a second region configured to transmit external light therethrough; a driving circuit unit disposed in the first region, the driving circuit unit including at least one thin film transistor (TFT) and at least one capacitor; a wire area including a third region adjacent to the first region and a fourth region adjacent to the second region, at least one wire configured to transfer a signal to the driving circuit unit being disposed in the wire area; a first electrode disposed in the first region and electrically connected to the driving circuit unit; a pixel defining layer disposed at least in the first region, the pixel defining layer including a first opening exposing a portion of the first electrode and a second opening corresponding to the second region; a second electrode disposed at least in the first region to be opposite to the first electrode; an intermediate layer disposed between the first electrode and the second electrode, the intermediate layer including an organic emission layer; and an insulating structure disposed between the substrate and the pixel defining layer, the insulating structure including at least one insulating layer that includes a third opening corresponding to the second region and the fourth region.

An area of the third opening may be larger than an area of the second opening.

The insulating structure may include: a first insulating layer and a third insulating layer each having a first refractive index; and a second insulating layer disposed between the first insulating layer and the third insulating layer, the second insulating layer having a second refractive index different from the first refractive index, and the second insulating layer may include the third opening.

Each of the first insulating layer and the third insulating layer may be formed of a single layer including silicon oxide ($SiO_2$), and the second insulating layer may be formed of a single layer including silicon nitride (SiNx).

The driving circuit unit may include: an active pattern disposed on the substrate, the active pattern including an active layer of the at least one TFT; a first conductive pattern disposed on the active pattern to be insulated from the active pattern, the first conductive pattern including a gate electrode of the at least one TFT; a second conductive pattern disposed on the first conductive pattern, the second conductive pattern including an upper electrode of the capacitor; and a third conductive pattern disposed on the second conductive pattern, the third conductive pattern including the at least one wire.

The first insulating layer may be disposed between the active pattern and the first conductive pattern, the second insulating layer may be disposed between the first conductive pattern and the second conductive pattern, and the third insulating layer may be disposed between the second conductive pattern and the third conductive pattern.

The at least one wire may be a data line configured to transfer a data signal to the driving circuit unit.

The upper electrode may be disposed to overlap the gate electrode in plan view.

The third conductive pattern including the at least one wire may have a thickness of about 5,000 Å to about 7,000 Å.

The organic light-emitting display apparatus may further include: a fourth insulating layer disposed on the third insulating layer between the second conductive pattern and the third conductive pattern, the fourth insulating layer including an inorganic material; and a via insulating layer configured to cover the third conductive pattern, the via insulating layer including an organic material.

The third insulating layer may include a fourth opening corresponding to the second region and the fourth region, the fourth insulating layer may include a fifth opening corresponding to the second region and the fourth region, and the via insulating layer may include a sixth opening corresponding to the second region.

An etching surface of the third opening, an etching surface of the fourth opening, and an etching surface of the fifth opening may be connected to each other without a step, and an etching surface of the second opening may be connected to an etching surface of the sixth opening without a step.

The pixel may include a plurality of pixels including a first pixel and a second pixel adjacent to each other along a first direction, the wire area may correspond to a region between the first pixel and the second pixel, and the at least one wire may include a data line extending along a second direction crossing the first direction.

The third opening may be connected to the first pixel and the second pixel along the first direction.

Each of the first and second pixels may include a first subpixel, a second subpixel, and a third subpixel that are disposed in the first region, and the first subpixel, the second subpixel, and the third subpixel may respectively emitting red light, green light, and blue light.

The third opening may overlap with at least a portion of the data line disposed in the wire area and the second opening included in each of the first and second pixels in plan view.

A distance between an etching surface of the second opening and the at least one wire may be about 2.5 µm to about 3.5 µm.

An angle between an etching surface of the third opening and the substrate may be about 70 degrees or less.

The second electrode may include a seventh opening corresponding to the second region.

The intermediate layer may further include a common layer disposed between the first electrode and the organic emission layer and/or between the organic emission layer and the second electrode, and the common layer may be disposed in the first region, the second region, and the wire area.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
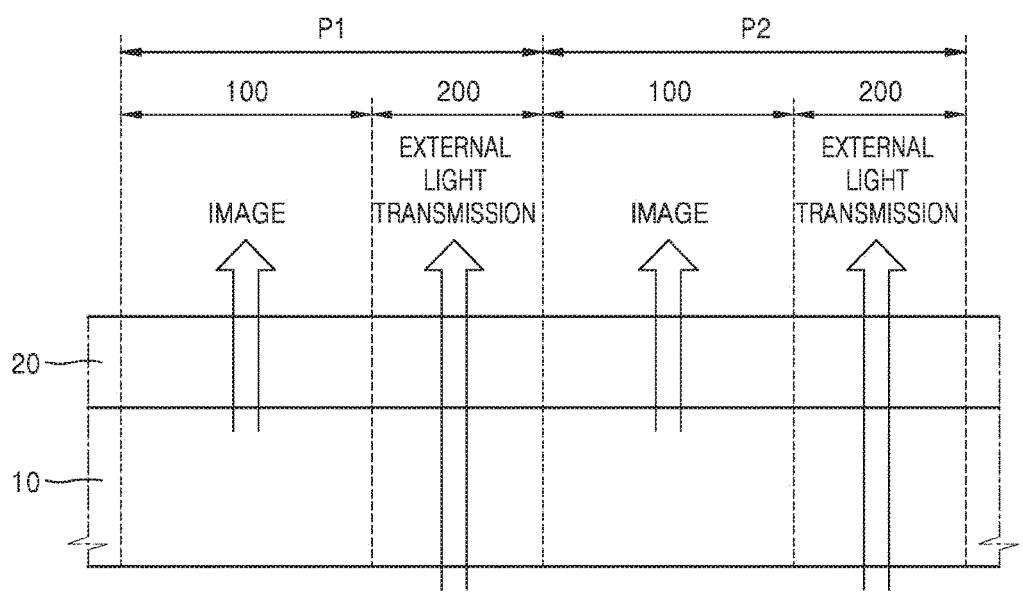
FIG. 1 is a cross-sectional view schematically illustrating an organic light-emitting display apparatus according to an exemplary embodiment.

References are made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are described below, by referring to the figures, only for the purpose of explaining aspects of the present description. As used herein, the term "and/or" includes any and all combinations of one or more of the associated listed items. Expressions such as "at least one of" when preceding a list of elements, modify the entire list of elements and do not modify the individual elements of the list.

The effects and features of the present disclosure will become apparent from the following description of the embodiments with reference to the accompanying drawings. The present disclosure, however, may be embodied in different forms and should not be construed as being limited to the embodiments set forth herein.

Hereinafter, embodiments of the present disclosure are described in detail with reference to the accompanying drawings. In the present specification and drawings, like reference numerals refer to like elements throughout.

Although the terms "first", "second", etc. may be used herein to describe various components, these components are not limited by these terms. These components are only used to distinguish one component from another.

As used herein, the singular forms "a," "an" and "the" include the plural forms as well, unless the context clearly indicates otherwise.

The terms "comprises" and/or "comprising" used herein specify the presence of stated features or components, but do not preclude the presence or addition of one or more other features or components.

When a layer, region, or component is referred to as being "formed on," another layer, region, or component, it may be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Hereinafter, exemplary embodiments are described in detail with reference to the accompanying drawings.

FIG. 1 is a cross-sectional view schematically illustrating an organic light-emitting display apparatus according to an exemplary embodiment.

Referring to FIG. 1, the organic light-emitting display apparatus according to an exemplary embodiment may include a substrate 10 and a display unit 20 that is disposed on the substrate 10 and includes a plurality of pixels P1 and P2, each of which includes a first region 100 emitting light and a second region 200, and through which external light is transmitted. The external light denotes light that is incident on the organic light-emitting display apparatus from the outside of the organic light-emitting display apparatus. External light incident on one surface of the organic light-emitting display apparatus may pass through the substrate 10 and the display unit 20, may pass through the other surface opposite to the one surface of the organic light-emitting display apparatus, and may be recognized by a user.

That is, a user located on a side where an image is realized may watch an image displayed on an outer side of the substrate 10. In the exemplary embodiment of FIG. 1, a top emission type in which an image displayed by the display unit 20 is realized in a direction opposite to the substrate 10, but the present embodiment is not limited thereto. That is, an organic light-emitting display apparatus according to another exemplary embodiment may have a bottom emission type in which an image displayed by the display unit 20 is realized in a direction toward the substrate 10, or a dual emission type in which an image displayed by the display unit 20 is realized in a direction toward the substrate 10 and in a direction opposite to the substrate 10.

In FIG. 1, a first pixel P1 and an adjacent second pixel P2 included in the organic light-emitting display apparatus according to an exemplary embodiment are illustrated. Each of the plurality of pixels P1 and P2 may include the first region 100 and the second region 200. An image may be realized from the first region 100 of the display unit 20, and external light may be transmitted through the second region 200. Although not shown, the second region 200 may be disposed to be connected to a plurality of pixels.

According to an exemplary embodiment, each of the plurality of pixels P1 and P2 may include the first region 100 emitting light having a certain color and the second region 200 through which external light is transmitted. A user may see, through the organic light-emitting display apparatus, an image displayed by the display unit 20 and an external image.

An element, including opaque metal like a thin film transistor (TFT), a capacitor, and an organic light-emitting device, may not be disposed in the second region 200. Due to such a configuration, an external light transmittance of the second region 200 increases.

Figure 2:
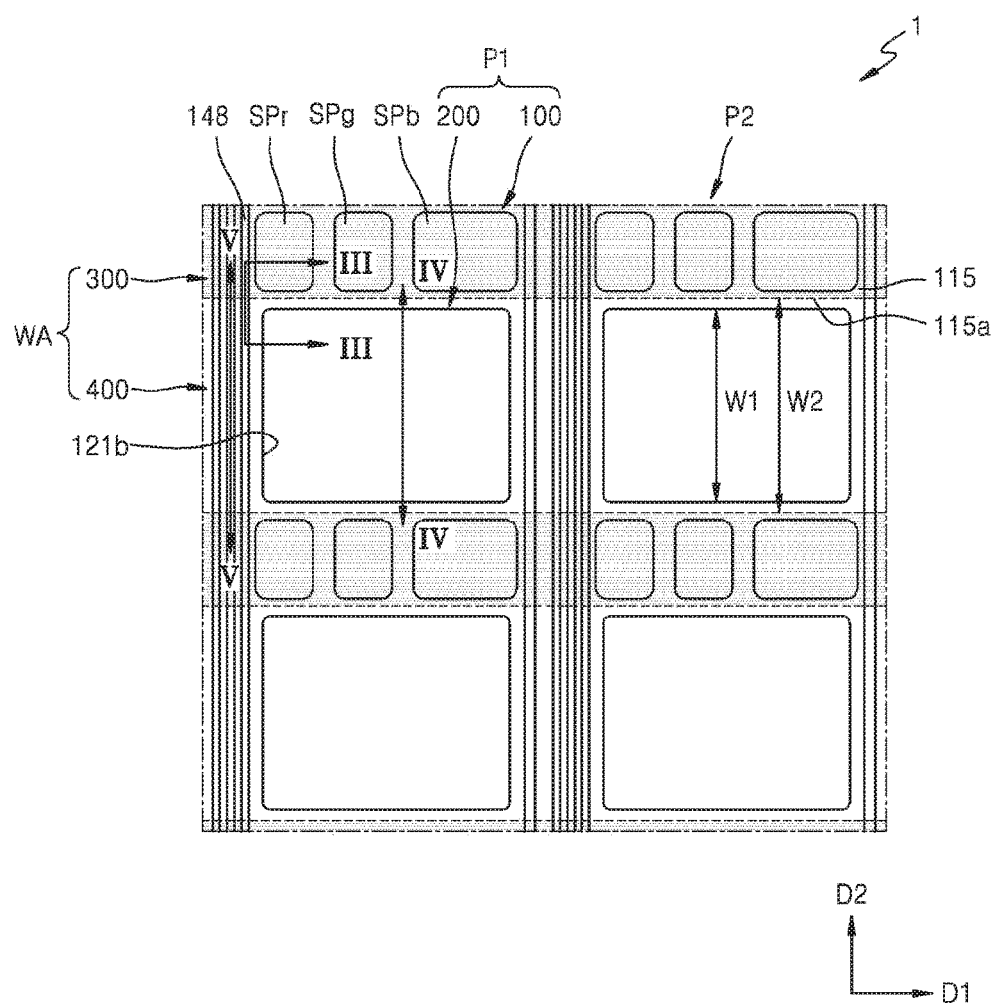
FIG. 2 is a plan view schematically illustrating a plurality of pixels included in an organic light-emitting display apparatus according to an exemplary embodiment.
Figure 3:
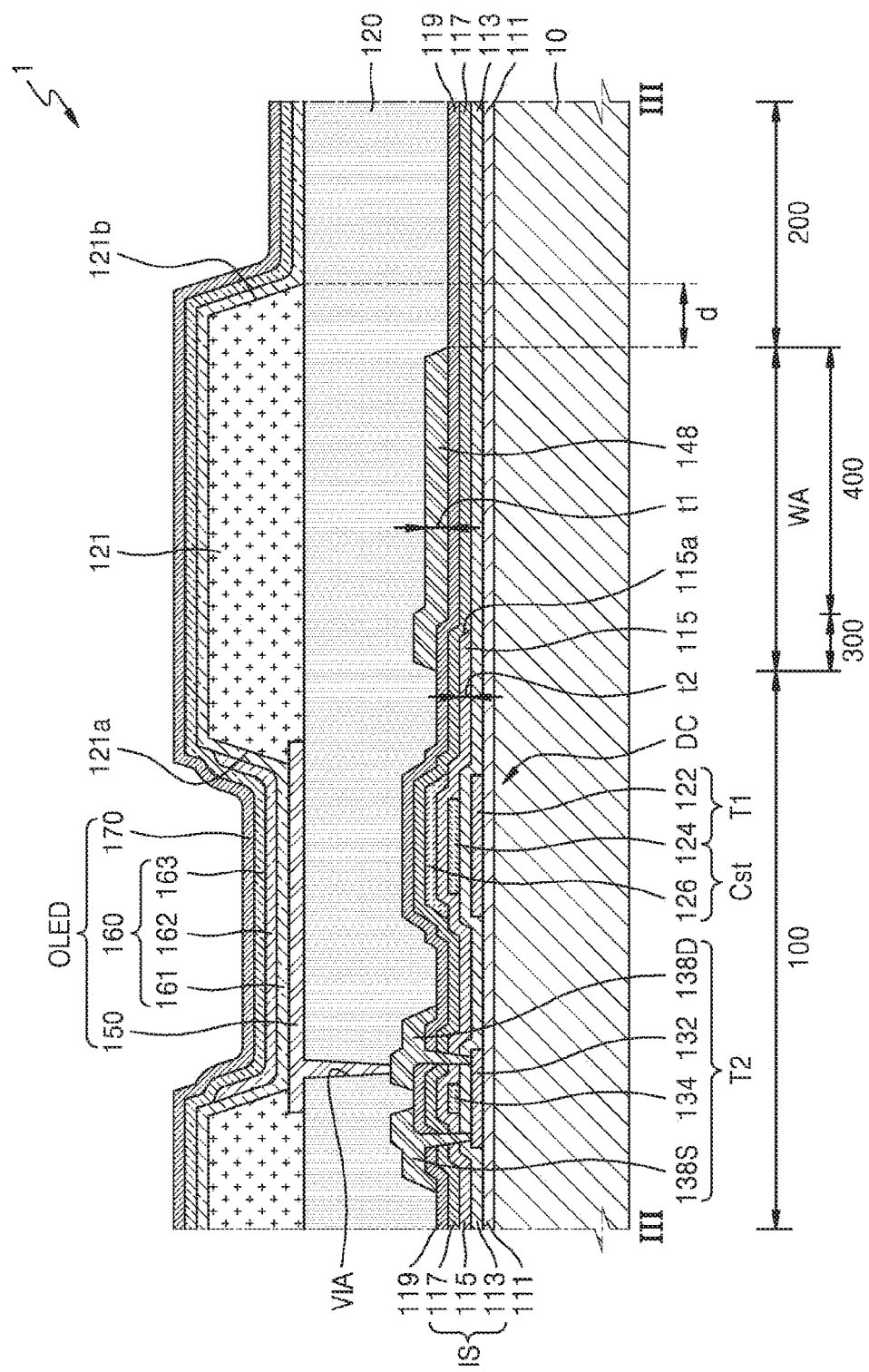
FIG. 3 is a cross-sectional view taken along line III-III of FIG. 2.
Figure 4:
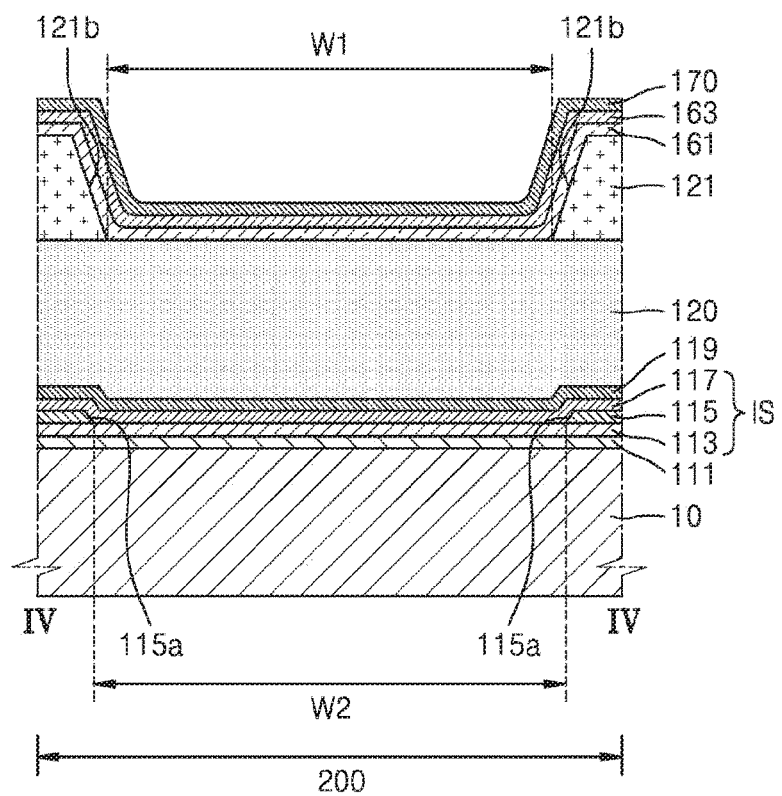
FIG. 4 is a cross-sectional view taken along line IV-IV of FIG. 2.
Figure 5:
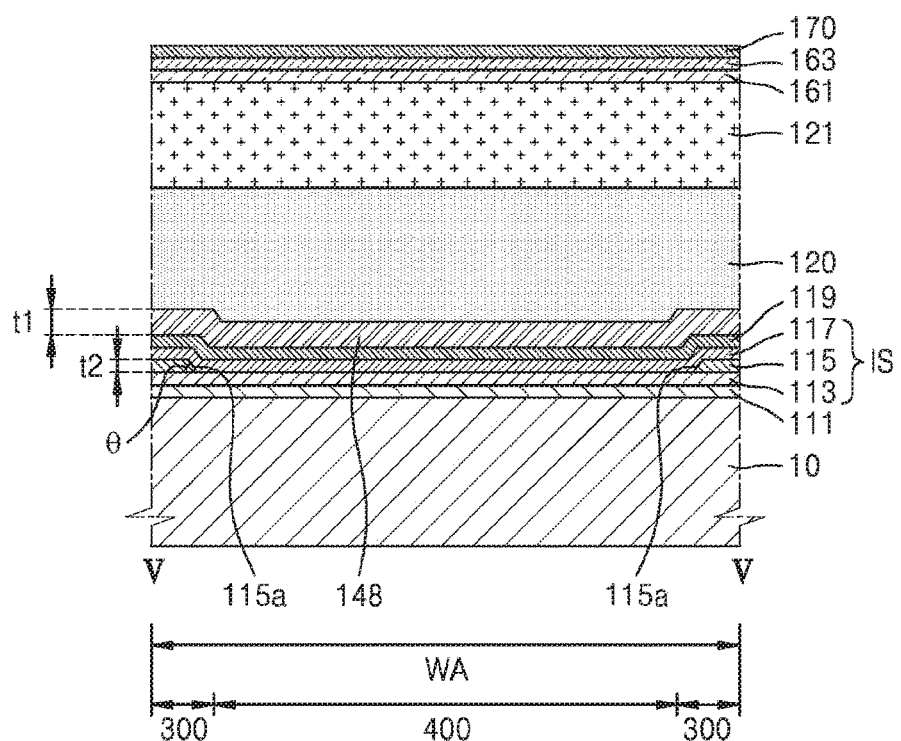
FIG. 5 is a cross-sectional view taken along line V-V of FIG. 2.

FIG. 2 is a plan view schematically illustrating a plurality of pixels included in an organic light-emitting display apparatus 1 according to an exemplary embodiment. FIG. 3 is a cross-sectional view taken along line III-III of FIG. 2. FIG. 4 is a cross-sectional view taken along line IV-IV of FIG. 2. FIG. 5 is a cross-sectional view taken along line V-V of FIG. 2.

Referring to FIGS. 2 to 5, the organic light-emitting display apparatus 1 according to an exemplary embodiment may include a substrate 10 and a pixel P1 that is disposed on the substrate 10 and includes a first region 100 realizing an image and a second region 200 through which external light is transmitted, a driving circuit unit DC disposed in the first region 200 and including at least one thin film transistor (TFT) T1 and at least one capacitor Cst, a wire area WA including a third region 300 adjacent to the first region 100 and a fourth region 400 adjacent to the second region 200 and in which at least one wire 148 for transferring a signal to the driving circuit unit DC is disposed, a first electrode 150 disposed in the first region 100 and electrically connected to the driving circuit unit DC, a pixel defining layer 121 disposed at least in the first region 100 and including a first opening 121a exposing a portion of the first electrode 150 and a second opening 121b corresponding to the second region 200, a second electrode 170 disposed at least in the first region 100 and opposite to the first electrode 150, and an intermediate layer 160 disposed between the first electrode 150 and the second electrode 170 and including an organic emission layer 162, and an insulating structure IS disposed between the substrate 10 and the pixel defining layer 121 and including at least one insulating layer 115 and a third opening 115a corresponding to the second region 200 and the fourth region 400.

The pixel P1 included in the organic light-emitting display apparatus 1 may include the first region 100 emitting light having a certain color and the second region 200 through which external light is transmitted. A user may see, through the second region 200, an image outside the organic light-emitting display apparatus 1. That is, the organic light-emitting display apparatus 1 may be implemented with a transparent display.

A first subpixel SPr, a second subpixel SPg, and a third subpixel SPb, which emit lights having different colors, may be disposed in the first region 100. The first subpixel SPr, the second subpixel SPg, and the third subpixel SPb may respectively emit red light, green light, and blue light. However, the present embodiment is not limited thereto. In other exemplary embodiments, if white light is realized by combination, arbitrary colors may be combined.

Each of first subpixel SPr, the second subpixel SPg, and the third subpixel SPb may be driven by the driving circuit unit DC, which includes at least one transistor T1 and at least one capacitor Cst. According to an exemplary embodiment, at least a portion of the driving circuit unit DC may be disposed to overlap with the first electrode 150 included in each of the first subpixel SPr, the second subpixel SPg, and the third subpixel SPb in plan view. In such a configuration, the first electrode 150 may be a reflective electrode, and the second electrode 170 may be a transparent or semitransparent electrode. Such a structure may be suitable for the organic light-emitting display apparatus 1 having the top emission type. At least a portion of the pixel circuit unit may be disposed between the substrate 10 and the first electrode 150, and thus, a space occupied by the driving circuit unit DC in the pixel P1 is reduced. Accordingly, an aperture ratio and a transmittance of the organic light-emitting display apparatus 1 are enhanced.

However, the present embodiment is not limited thereto, and an organic light-emitting display apparatus according to another exemplary embodiment may have a bottom emission type in which a first electrode is a transparent or semitransparent electrode and a second electrode is a reflective electrode. In this case, the driving circuit unit DC may be disposed to not overlap with the first electrode 150 so as not to obstruct a path of emitted light.

The organic light-emitting display apparatus 1 according to an exemplary embodiment may include a plurality of pixels. Hereinafter, for convenience of description, two adjacent pixels among the plurality of pixels may be referred to as a first pixel P1 and a second pixel P2, respectively.

The first pixel P1 and the second pixel P2 may be disposed adjacent to each other along the first direction D1, and at least one wire 148 extending along a second direction D2 crossing the first direction D1 may be disposed between the first pixel P1 and the second pixel P2. According to an exemplary embodiment, the wire 148 extending along the second direction D2 may be a data line for transferring a data signal to the driving circuit unit DC and/or a power line for applying a driving voltage.

The second region 200 may be a transparent region where light incident on one surface of the substrate 10 from the outside of the organic light-emitting display apparatus 1 passes through the organic light-emitting display apparatus 1 and is recognized by a user, and thus, a reflective electrode, an opaque wire, and/or the like may not be disposed in the second region 200. The second region 200 may be divided by an opaque wire or an opaque electrode. According to an exemplary embodiment, the second region 200 may be defined as a region between an opaque wire and another opaque wire spaced apart therefrom. However, the present embodiment is not limited thereto. In other exemplary embodiments, if the pixel defining layer 121 is formed of a light-absorbing material, the second region 200 may be defined as a region where the second opening 121b included in the pixel defining layer 121 is disposed.

Referring to FIG. 4, an insulating structure IS including a first insulating layer 113, a second insulating layer 115, and a third insulating layer 117 sequentially disposed on the substrate 10 may be disposed in the second region 200. The second insulating layer 115 included in the insulating structure IS may include a third opening 115a corresponding to the second region 200. A buffer layer 111 may be disposed between the substrate 10 and the first insulating layer 113, and a fourth insulating layer 119 may be further disposed on the third insulating layer 117. However, the buffer layer 111 and the fourth insulating layer 119 may be omitted. The first insulating layer 113 and the third insulating layer 117 may have a first refractive index, and the second insulating layer 115 may have a second refractive index different from the first refractive index.

According to an exemplary embodiment, the buffer layer 111, the first insulating layer 113, and the third insulating layer 117 may each be formed of silicon oxide ($SiO_2$) and/or the like, and the second insulating layer 115 and the fourth insulating layer 119 may each be formed of silicon nitride (SiNx) and/or the like. The silicon oxide ($SiO_2$) may have a refractive index of about 1.4 to about 1.5, and the silicon nitride (SiNx) may have a refractive index of about 1.8 to about 1.9. That is, the first refractive index may be about 1.4 to about 1.5, and the second refractive index may be about 1.8 to about 1.9. Some of the light incident on a boundary surface between layers having different refractive indexes may be reflected and refracted by the boundary surface between the layers having the different refractive indexes. When layers having different refractive indexes are disposed in the second region 200, a transmittance of the second region 200 is reduced, and a sharpness of an external background image of the organic light-emitting display apparatus 1 recognized by a user is reduced. Such a phenomenon further increases as a difference between the refractive indexes increases.

According to an exemplary embodiment, the second insulating layer 115 having a refractive index that differs from those of the first and third insulating layers 113 and 117 may include the third opening 115a corresponding to the second region 200, and thus, light is not reflected or refracted by a boundary surface between the first insulating layer 113 and the second insulating layer 115 and a boundary surface between the second insulating layer 115 and the third insulating layer 117. That is, a sharpness of an external background image and a transmittance of the organic light-emitting display apparatus 1 are improved.

Referring to FIGS. 2 and 5, the wire area WA may include the third region 300 adjacent to the first region 100 and the fourth region 400 adjacent to the second region 200. The third opening 115a, which is included in the second insulating layer 115 and is disposed in the second region 200, may extend to the fourth region 400 of the wire area WA adjacent to the second region 200.

That is, the first insulating layer 113, the second insulating layer 115, and the third insulating layer 117 may be disposed under the at least one wire 148 disposed in the wire area WA. The buffer layer 111 may be disposed between the substrate 10 and the first insulating layer 113, and the fourth buffer layer 119 may be further disposed on the third insulating layer 117. The buffer layer 111 and the fourth insulating layer 119 may be omitted. The second insulating layer 115 may include a third opening 115a corresponding to the fourth region 400 of the wire area WA, and the third opening 115a may be an opening extending from a portion of the third opening 115a disposed in the second region 200.

Therefore, the second insulating layer 115 may be disposed in the third region 300 of the wire area WA, but may not be disposed in the fourth region 400. The wire 148 may extend from a region where the second insulating layer 115 is disposed to a region where the second insulating layer 115 is not disposed.

The wire 148 may have a thickness t1 of about 5,000 Å to about 7,000 Å, and the second insulating layer 115 may have a thickness t2 that is relatively thinner than that of the wire 148. According to an exemplary embodiment, the thickness t2 of the second insulating layer 115 may be about 1,000 Å to about 2,000 Å, and an angle "θ" between an etching surface of the third opening 115a and the substrate 10 may be about 70 degrees or less. Therefore, the wire 148 smoothly extends along a step caused by the third opening 115a included in the second insulating layer 115 without the wire 148 being cut or a resistance of the wire 148 increasing.

When the third opening 115a is formed at only a position corresponding to the second region 200 in the second insulating layer 115 so as to improve a transmittance and a sharpness of the second region 200, the wire 148 may be formed at a position that is spaced apart from the an etching surface of the third opening 115a by a certain distance. When the etching surface is excessively close to the wire 148, the wire 148 is partially detached. When it is assumed that an area of the one pixel P1 is constant, an area of the third opening 115a is inevitably reduced for securing a distance between the etching surface and the wire 148. In such case, a transmittance of the second region 200 is reduced.

According to an exemplary embodiment, the third opening 115a included in the second insulating layer 115 may extend to the fourth region 400 of the wire area WA as well as the second region 200, and thus, the etching surface of the third opening 115a may not be disposed between the second region 200 and the fourth region 400. That is, since it is not required to secure a process margin, a transmittance of the second region 200 is improved.

The third opening 115a may extend from the second region 200 included in the first pixel P1 to the fourth region 400 of the wire area WA disposed between the first pixel P1 and the second pixel P2 and may extend from the fourth region 400 to the second region 200 of the second pixel P2. That is, the third opening 115a may extend to be connected to the first and second pixels P1 and P2 along the first direction D1. Although not shown, the third opening 115a may extend along the first direction D1 to be connected to all pixels disposed along the first direction D1 of the organic light-emitting display apparatus 1.

Hereinafter, a structure of the organic light-emitting display apparatus 1 according an embodiment is described in a stacking sequence with reference to FIG. 3.

The substrate 10 may be formed of glass, plastic, and/or the like. The buffer layer 111 may be disposed on the substrate 10. The buffer layer 111 may be a single layer formed of $SiO_2$, and prevents impurities from penetrating to the driving circuit unit DC from the substrate 10 and planarizes a surface of the substrate 10. The buffer layer 111 may be omitted.

The driving circuit unit DC may be disposed in the first region 100 on the buffer layer 111 and may include a TFT T1. According to an exemplary embodiment, the TFT T1 may be a driving TFT T1. The driving TFT T1 may include an active layer 122 and a gate electrode 124 that are disposed over the buffer layer 111. A first insulating layer 113 may be disposed between the active layer 122 and the gate electrode 124. The first insulating layer 113 may be a gate insulating layer and may extend from the first region 100 to the second region 200. The first insulating layer 113 may be a single layer formed of $SiO_2$.

The active layer 122 may include various materials. According to an exemplary embodiment, the active layer 122 may include an inorganic semiconductor material such as amorphous silicon (a-Si) or crystalline silicon. According to another exemplary embodiment, the active layer 122 may include an oxide semiconductor or an organic semiconductor material.

The first gate electrode 124 may be a single layer or a multi-layer formed of at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). According to an exemplary embodiment, the gate electrode 124 may be a single layer formed of Mo, and a thickness of the gate electrode 124 may be about 2,000 Å to about 3,000 Å. A second insulating layer 115 covering the gate electrode 124 may be disposed on the first insulating layer 113. The second insulating layer 115 may be a single layer formed of SiNx.

An upper electrode 126 of the capacitor Cst may be disposed in the first region 100 on the second insulating layer 115. The upper electrode 126 may be a single layer or a multi-layer formed of at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). According to an exemplary embodiment, the upper electrode 126 may be a single layer formed of Mo, and a thickness of the gate electrode 124 may be about 2,000 Å to about 3,000 Å.

The upper electrode 126 may configure the capacitor Cst along with the gate electrode 124. That is, the gate electrode 124 may function as the gate electrode 124 of the driving TFT T1 and a lower electrode of the capacitor Cst. That is, the driving TFT T1 and the capacitor Cst occupying a broad area in the driving circuit unit DC may be formed to overlap each other in plan view, and thus, a high-capacity capacitor Cst may be implemented, and an area of the driving circuit unit DC is minimized. Due to such a configuration, the organic light-emitting display apparatus 1 may be implemented to have a high resolution, and an area of the second region 200 is enlarged, thereby enhancing a transmittance.

The second insulating layer 115 may function as a dielectric layer of the capacitor Cst, and as a refractive index of the dielectric layer increases, a capacity of the capacitor Cst increases. Therefore, the second insulating layer 115 may be formed of SiNx, which has a relatively greater refractive index than SiO$_2$. However, as described above, when the second insulating layer 115 extends to the second region 200 and is disposed between the first insulating layer 113 and the third insulating layer 117, which each are formed of SiO$_2$, reflection and refraction occur in a boundary surface between the first insulating layer 113 and the second insulating layer 115 and a boundary surface between the second insulating layer 115 and the third insulating layer 117. However, according to an exemplary embodiment, the second insulating layer 115 may include the third opening 115a corresponding to the second region 200 and the fourth region 400 of the wire area WA adjacent to the second region 200, and the third insulating layer 117 may be disposed on the first insulating layer 113 disposed in the second region 200 to contact the first insulating layer 113. Since the first insulating layer 113 and the third insulating layer 117 have the same refractive index, the reflection and the refraction do not occur.

The third insulating layer 117 may be disposed on the second insulating layer 115 to cover the upper electrode 126. The third insulating layer 117 may extend from the first region 100 to the second region 200 and may be a single layer formed of SiO$_2$. The fourth insulating layer 119 may be disposed on the third insulating layer 117. The fourth insulating layer 119 may be a single layer formed of SiNx, and depending on the case, the fourth insulating layer 119 may be omitted.

The at least one wire 148 may be disposed in the wire area WA on the third insulating layer 117 and may be a data line for transferring a data signal to the driving circuit unit DC and/or a power line for applying a driving voltage.

A via insulating layer 120 covering the driving circuit unit DC and the wire 148 may be disposed on the third insulating layer 117 and may be disposed in the first region 100, the second region 200, and the wire area WA. The via insulating layer 120 may be formed of an organic material for planarizing a step caused by the driving circuit unit DC and the wire 148, and for example, may be formed of polyimide (PI) and/or the like.

The driving circuit unit DC disposed in the first region 100 may further include an emission control TFT T2 electrically connected to the driving TFT T1, in addition to the driving TFT T1. According to an exemplary embodiment, the driving TFT T1 may be electrically connected to a first electrode 150 of an organic light-emitting device OLED through the emission control TFT T2. The emission control TFT T2 may include an active layer 132, a gate electrode 134, and a source electrode 138S and a drain electrode 138D electrically connected to the active layer 132.

The active layer 132 of the emission control TFT T2 may be disposed on the same layer as the active layer 122 of the driving TFT T1, and the gate electrode 134 of the emission control TFT T2 may be disposed on the same layer as the gate electrode 124 of the driving TFT T1. Also, the source electrode 138S and the drain electrode 138D may be disposed on the same layer and may each be formed of the same material.

The active layers 122 and 132 may each be a portion of an active pattern disposed on the buffer layer 111, and the gate electrodes 124 and 134 may each be a portion of a first conductive pattern disposed on the first insulating layer 113. The upper electrode 126 may be a portion of a second conductive pattern disposed on the second insulating layer 115, and the source electrode 138S, the drain electrode 138D, and the wire 148 may each be a portion of a third conductive pattern disposed on the third and fourth insulating layers 117 and 119.

The source electrode 138S, the drain electrode 138D, and the wire 148 may be a single layer or a multi-layer formed of at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). According to an exemplary embodiment, the source electrode 138S, the drain electrode 138D, and the wire 148 may each be formed of a triple layer of Mo/Al/Mo or Ti/Al/Ti and may have substantially the same thickness t1.

The organic light-emitting device OLED may be disposed in the first region 100 on the via insulating layer 120. Here, the organic light-emitting device OLED may include the first electrode 150, which is electrically connected to the drain electrode 138D of the emission control TFT T2 through a via hole VIA included in the via insulating layer 120, the second electrode 170 opposite to the first electrode 150, and an intermediate layer 160, which is disposed between the first electrode 150 and the second electrode 170 and includes an organic emission layer 162.

Both edges of the first electrode 150 may be covered by the pixel defining layer 121. The pixel defining layer 121 may be disposed at least in the first region 100, and include the first opening 121a exposing a portion of the first electrode 150, and the second opening 121b corresponding to the second region 200.

A distance d between an etching surface of the second opening 121b and the wire 148 may be about 2.5 μm to about 3.5 μm. When the distance d is about 2.5 μm or less, a process margin is not secured, and for this reason, a portion of the pixel defining layer 121 is partially detached. When the distance d is about 3.5 μm or more, an area of the second opening 121b is reduced, and for this reason, a transmittance of the organic light-emitting display apparatus 1 is reduced.

According to an exemplary embodiment, the pixel defining layer 121 may be formed of an organic material such as polyimide (PI) and/or the like. According to another exemplary embodiment, the pixel defining layer 121 may include a light-absorbing material such as a black pigment and/or the like. That is, the pixel defining layer 121 may be formed in black, and in this case, the second region 200 may be defined as a region where the pixel defining layer 121 is not disposed. When the pixel defining layer 121 is formed of a light-absorbing material, like devices and wires included in the driving circuit unit DC, light incident on a material capable of reflecting the light and light reflected by the material are blocked, thereby enhancing a visibility of the organic light-emitting display apparatus 1.

The first electrode 150 may be configured as a reflective electrode and may include a reflective layer, including Ag, Mg, Al, Pt, Pd, Au, Ni, Nd, Ir, Cr, and a compound thereof, and a transparent or semi-transparent electrode layer formed on the reflective layer. The first electrode 150 may be independently formed in an island form in each of subpixels.

The second electrode 170 may be configured as a transparent or semi-transparent electrode and may include one or more materials selected from among Ag, Al, Mg, Li, Ca, Cu, LiF/Ca, LiF/Al, MgAg, and CaAg. The second electrode 170 may be formed in a thin film form having several nm to several tens nm. The second electrode 170 may be provided to be electrically connected to all pixels included in the organic light-emitting display apparatus 1.

The intermediate layer 160 including the organic emission layer 162 may be disposed between the first electrode 150 and the second electrode 170, and a common layer, which is disposed in all the pixels in common, may be disposed between the first electrode 150 and the organic emission layer 162 and between the organic emission layer 162 and the second electrode 170. According to an exemplary embodiment, a first common layer 161 may be disposed between the first electrode 150 and the organic emission layer 162 and may include a hole injection layer (HIL) and/or a hole transport layer (HTL). A second common layer 163 may be disposed between the second electrode 170 and the organic emission layer 162 and may include an electron injection layer (EIL) and/or an electron transport layer (ETL).

The first common layer 161, the second common layer 163, and the second electrode 170 may be disposed in the first region 100, the second region 200, and the wire area WA. Each of the first common layer 161, the second common layer 163, and the second electrode 170 may be formed in common in all the pixels included in the organic light-emitting display apparatus 1 and may be high in transmittance, whereby the first common layer 161, the second common layer 163, and the second electrode 170 may be disposed in a whole region of the organic light-emitting display apparatus 1. However, the present embodiment is not limited thereto. That is, to increase a transmittance of the second region 200, at least one of the first common layer 161, the second common layer 163, and the second electrode 170 may include an opening corresponding to the second region 200.

The organic emission layer 162 may emit red light, green light, or blue light. However, the present embodiment is not limited thereto. In other exemplary embodiments, if white light is realized by combination, arbitrary colors in addition to red, green, and blue may be combined.

Referring again to FIG. 4, the second opening 121b of the pixel defining layer 121 and the third opening 115a of the second insulating layer 115 may be disposed in the second region 200. That is, the second opening 121b and the third opening 115a may be disposed to overlap each other in plan view. A width W2 of the third opening 115a in the second direction D2 may be greater than a width W1 of the second opening 121b in the second direction D2. The third opening 115a may be formed all over the second region 200 and the fourth region 400 in the first direction D1, and a width of the third opening 115a in the first direction D1 may be larger than a width of the second opening 121b in the first direction D1.

That is, an area of the third opening 115a may be larger than that of the second opening 121b. Here, an area of the third opening 115a does not denote a whole area of the third opening 115a extending in the first direction D1 but denotes an area of a region corresponding to one pixel in the third opening 115a. Therefore, a boundary between a region where the second insulating layer 115 is disposed and a region where the second insulating layer 115 is not disposed may be disposed outside the second opening 121b, but may not be disposed in a path of light passing through the second opening 121b. That is, the light passing through the second opening 121b may not be reflected or refracted by the boundary.

Due to such a configuration, a transmittance of the second region 200 and a sharpness of external image passing through the second region 200 are improved.

Figure 6A:
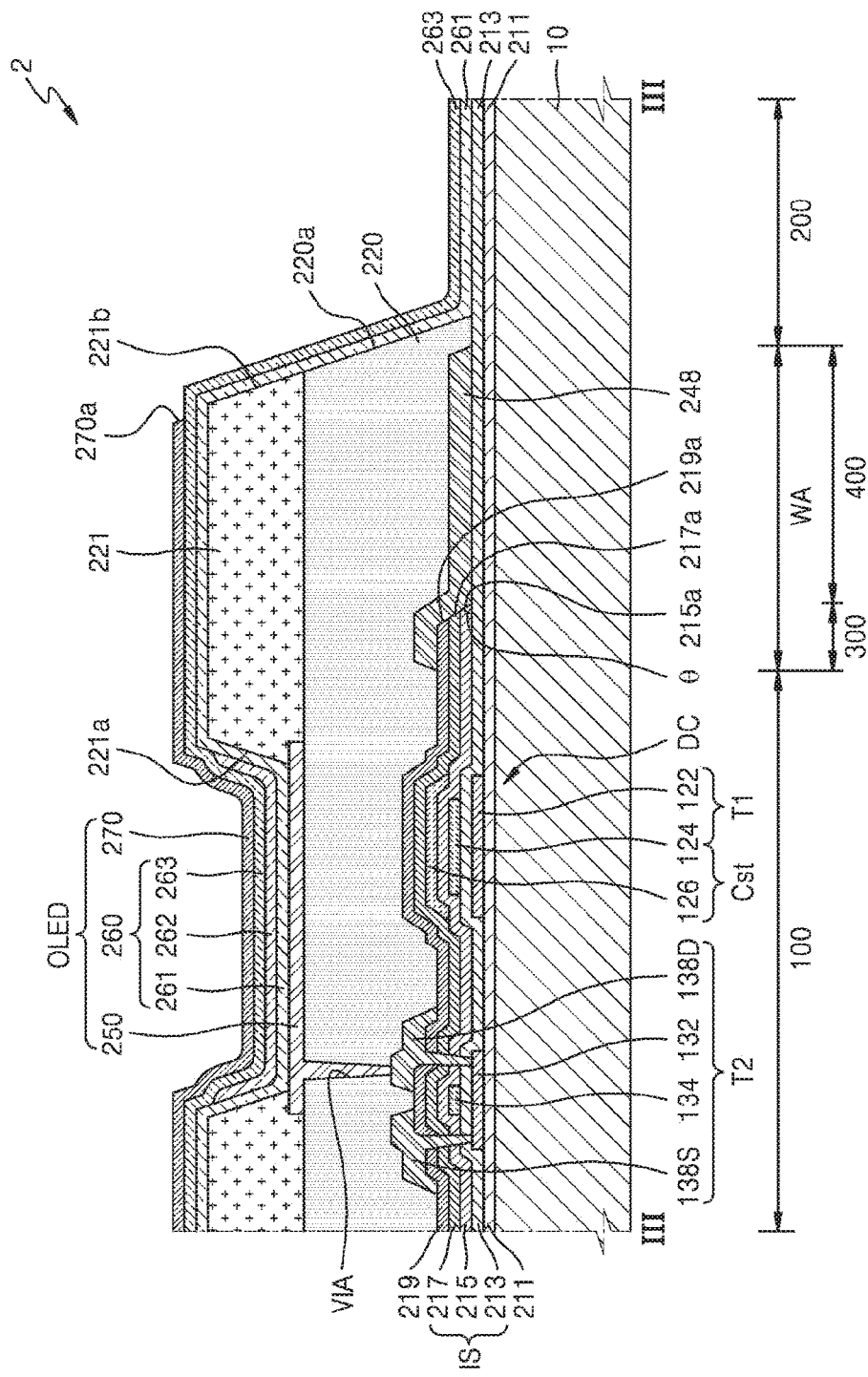
FIGS. 6A, 6B and 6C are cross-sectional views schematically illustrating an organic light-emitting display apparatus according to another exemplary embodiment.
Figure 6B:
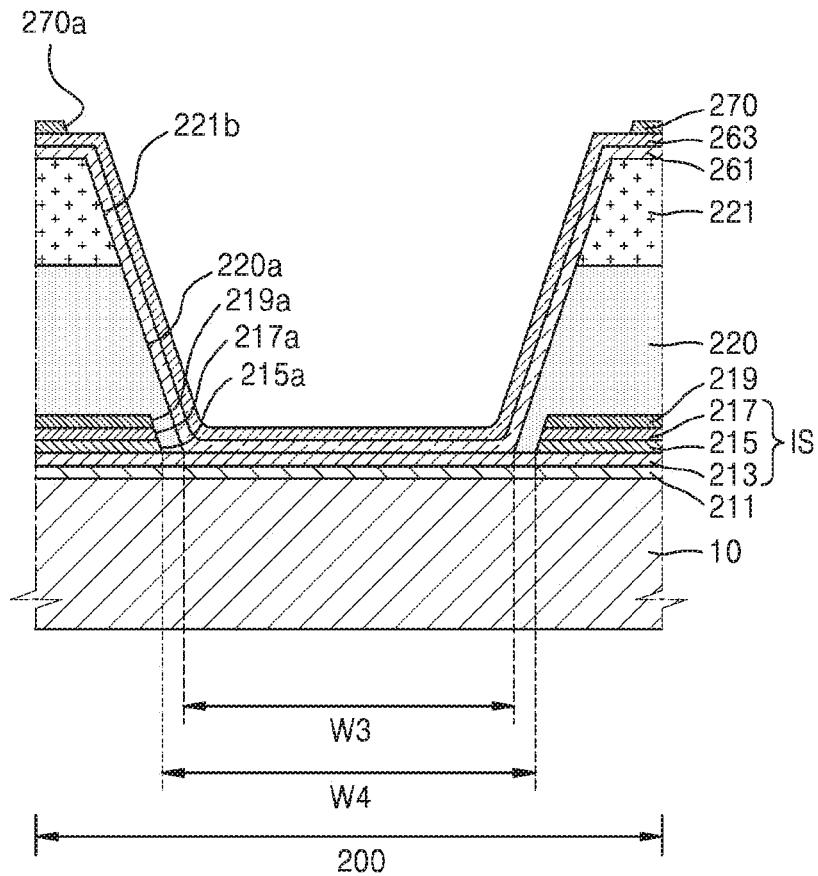
Figure 6C:
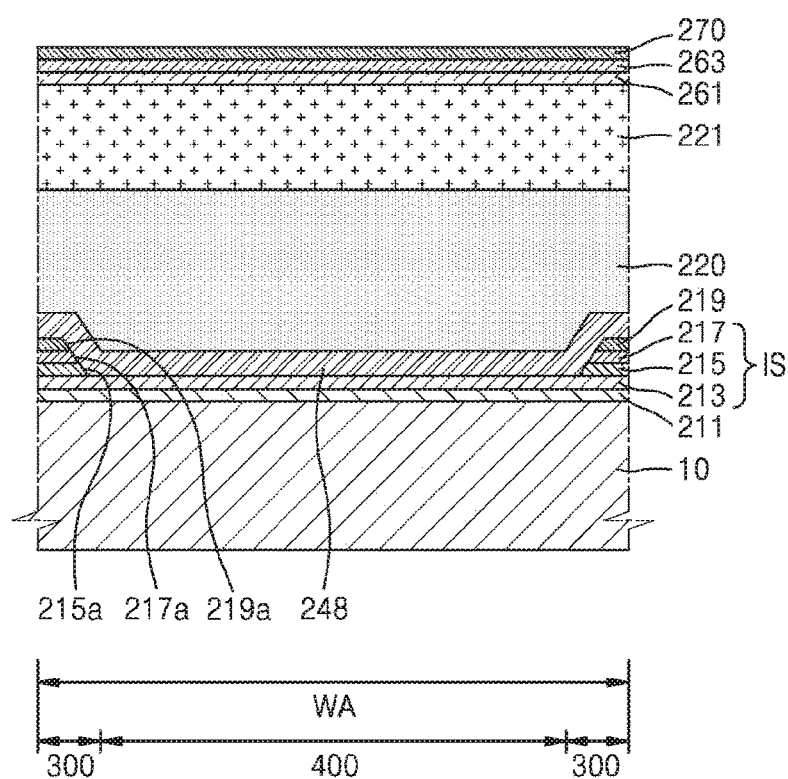

FIGS. 6A to 6C are cross-sectional views schematically illustrating an organic light-emitting display apparatus 2 according to another exemplary embodiment.

Referring to FIGS. 6A to 6C, the organic light-emitting display apparatus 2 according to another exemplary embodiment may include a substrate 10 and a pixel P1 (see FIG. 1) that is disposed on the substrate 10 and includes a first region 100 realizing an image and a second region 200 through which external light is transmitted, a driving circuit unit DC disposed in the first region 200 and including at least one TFT T1 and at least one capacitor Cst, a wire area WA including a third region 300 adjacent to the first region 100 and a fourth region 400 adjacent to the second region 200 and in which at least one wire 248 for transferring a signal to the driving circuit unit DC is disposed, a first electrode 250 disposed in the first region 100 and electrically connected to the driving circuit unit DC, a pixel defining layer 221 disposed at least in the first region 100 and including a first opening 221a exposing a portion of the first electrode 250 and a second opening 221b corresponding to the second region 200, a second electrode 270 disposed at least in the first region 100 and opposite to the first electrode 250, and an intermediate layer 260 disposed between the first electrode 250 and the second electrode 270 and including an organic emission layer 262, and an insulating structure IS disposed between the substrate 10 and the pixel defining layer 221 and including at least one insulating layer 215 and a third opening 215a corresponding to the second region 200 and the fourth region 400.

Referring to FIG. 6A, a driving TFT T1, a capacitor Cst, an emission control TFT T2, and an organic light-emitting device OLED are disposed in the first region 100 and may be the same as FIG. 3. Hereinafter, a difference with FIG. 3A is described in detail.

Referring to FIG. 6B, an insulating structure IS including a first insulating layer 213, a second insulating layer 215, and a third insulating layer 217 are sequentially disposed on the substrate 10 and may be disposed in the second region 200. A buffer layer 211 may be disposed between the substrate 10 and the first insulating layer 213, and a fourth insulating layer 219 may be disposed on the third insulating layer 217.

The second insulating layer 215, the third insulating layer 217, and the fourth insulating layer 219 may respectively include a third opening 215a, a fourth opening 217a, and a fifth opening 219a, which correspond to the second region 200. The third opening 215a, the fourth opening 217a, and the fifth opening 219a may extend from the second region 200 to the fourth region 400 of the wire area WA adjacent to the second region 200. The buffer layer 211, the first insulating layer 213, and the third insulating layer 217 may each be a single layer formed of $SiO_2$, and the second insulating layer 215 and the fourth insulating layer 219 may each be a single layer formed of SiNx.

The third opening 215a, the fourth opening 217a, and the fifth opening 219a may be simultaneously formed by the same etching process, and thus may each include the same etched surface. That is, an etching surface of the third opening 215a, an etching surface of the fourth opening 217a, and an etching surface of the fifth opening 219a may be connected to each other without a step. An angle "θ" between the substrate 10 and each of the etching surface of the third opening 215a, the etching surface of the fourth opening 217a, and the etching surface of the fifth opening 219a may be about 70 degrees or less. The angle "θ" may be set to about 70 degrees or less, and thus, a wire 248 formed along each of the etching surfaces is not cut, and a resistance of the wire 248 does not increase.

A via insulating layer 220 may be disposed on the fourth insulating layer 219, and the pixel defining layer 221 may be disposed on the via insulating layer 220. The via insulating layer 220 may include a sixth opening 220a, and the pixel defining layer 221 may include a second opening 221b. The via insulating layer 220 and the pixel defining layer 221 may each be formed of an organic material and may be simultaneously formed by the same etching process. That is, an etching surface of the sixth opening 220a may be connected to an etching surface of the second opening 221b without a step.

A width W3 of the sixth opening 220a may be smaller than a width W4 of the third opening 215a. Therefore, the via insulating layer 220 may cover a portion of each of the third opening 215a, the fourth opening 217a, and the fifth opening 219a and may extend to a top of the first insulating layer 213.

A first common layer 261 and a second common layer 263 extending from the first region 100 may be disposed on the first insulating layer 213 exposed by the third opening 215a, the fourth opening 217a, the fifth opening 219a, the sixth opening 220a, and the second opening 221b. The second electrode 270 extending from the first region 100 may be disposed on the second common layer 263. According to an exemplary embodiment, the second electrode 270 may include a seventh opening 270a corresponding to the second region 200.

According to an exemplary embodiment, the third opening 215a and the fifth opening 219a corresponding to the second region 200 may be respectively formed in the second insulating layer 215 and the fourth insulating layer 219, which are each formed of SiNx. In addition, the fourth opening 217a and the sixth opening 220a may be respectively formed in the third insulating layer 217 and the via insulating layer 220. Also, the seventh opening 270a corresponding to the second region 200 may be formed in the second electrode 270, which is a transparent or semi-transparent electrode, and thus, a transmittance of the second region 200 is further enhanced.

Referring to FIG. 6C, the wire area WA may include the third region 300 adjacent to the first region 100 and the fourth region 400 adjacent to the second region 200. The third opening 215a, the fourth opening 217a, and the fifth opening 219a, which are disposed in the second region 200 and are respectively included in the second insulating layer 215, the third insulating layer 217, and the fourth insulating layer 219, may extend to the fourth region 400 of the wire area WA adjacent to the second region 200.

That is, the first insulating layer 213, the second insulating layer 215, and the third insulating layer 217 may be disposed under at least one wire 248 disposed in the wire area WA. The buffer layer 211 may be disposed between the substrate 10 and the first insulating layer 213, and the fourth insulating layer 219 may be disposed on the third insulating layer 217.

The second insulating layer 215, the third insulating layer 217, and the fourth insulating layer 219 may respectively include a third opening 215a, a fourth opening 217a, and a fifth opening 219a, which correspond to the fourth region 400 of the wire area WA. The third opening 215a, the fourth opening 217a, and the fifth opening 219a may be respective openings that extend from a portion of each of the third opening 215a, the fourth opening 217a, and the fifth opening 219a disposed in the second region 200.

Therefore, the second insulating layer 215, the third insulating layer 217, and the fourth insulating layer 219 may be disposed in the third region 300 of the wire area WA, and may not be disposed in the fourth region 400. The wire 248 may extend from a region where the insulating layers 215, 217 and 219 are disposed to a region where the insulating layers 215, 217 and 219 are not disposed.

The via insulating layer 220 and the pixel defining layer 221 may be disposed on the wire 248. That is, the sixth opening 220a included in the via insulating layer 220 and the second opening 221b included in the pixel defining layer 221 may be disposed to correspond to only the second region 200, and may not be disposed in the fourth region 400.

In FIGS. 6A to 6C, a case in which the buffer layer 211 and the first insulating layer 213 do not include an opening is described, but the present embodiment is not limited thereto. According to another exemplary embodiment, at least one of the buffer layer 211 and the first insulating layer 213 may each include an opening corresponding to the second region 200 and/or the fourth region 400.

The other elements of the organic light-emitting display apparatus 2 illustrated in FIGS. 6A to 6C are the same as the organic light-emitting display apparatus 1 of FIG. 3, and thus, their descriptions are not repeated.

Figure 7:
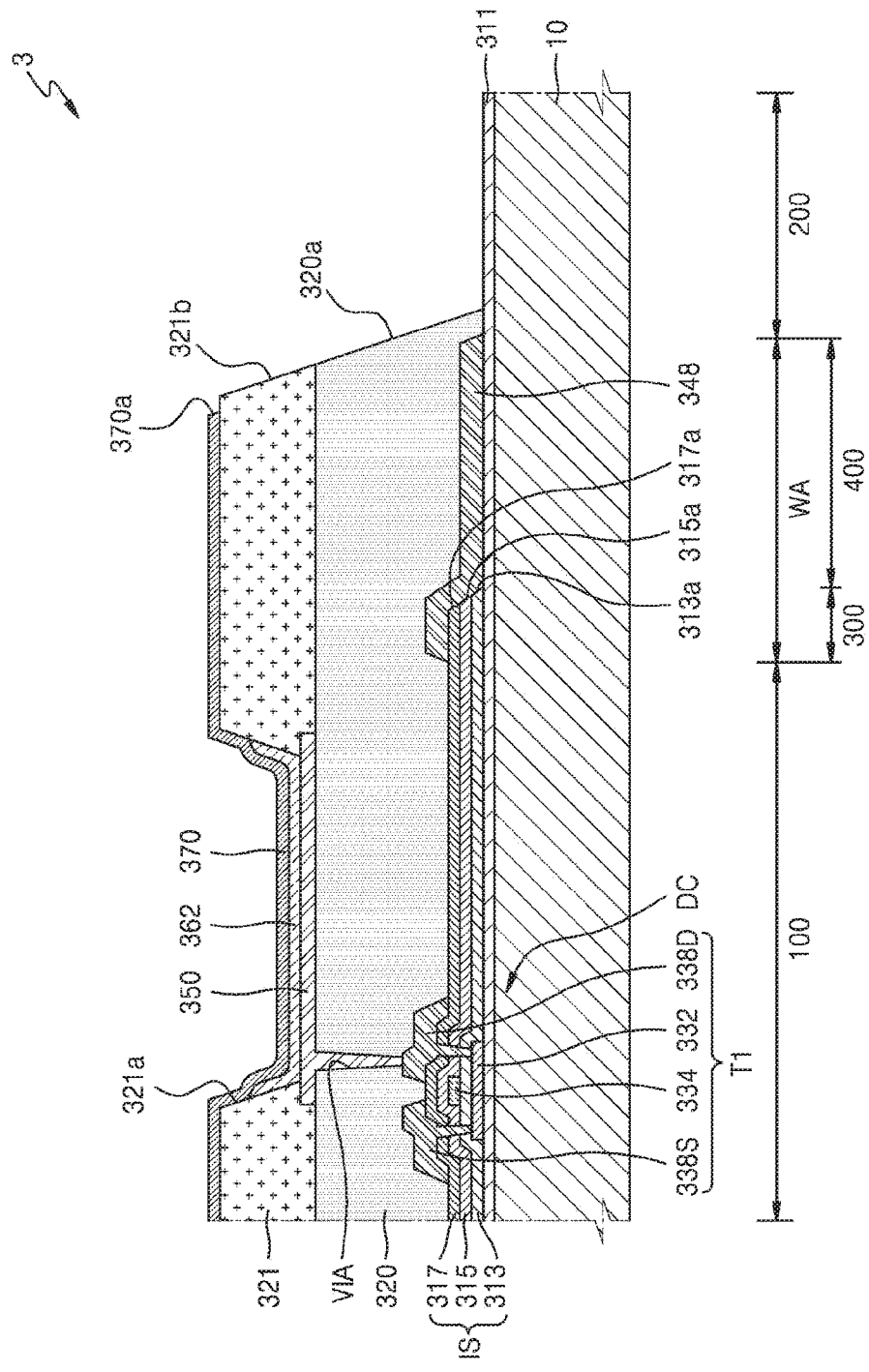
FIG. 7 is a cross-sectional view schematically illustrating an organic light-emitting display apparatus according to another exemplary embodiment.

FIG. 7 is a cross-sectional view schematically illustrating an organic light-emitting display apparatus 3 according to another exemplary embodiment.

Referring to FIG. 7, the organic light-emitting display apparatus 3 according to another exemplary embodiment may include a substrate 10 and a pixel P1 (see FIG. 1) disposed on the substrate 10 and including a first region 100 realizing an image and a second region 200 through which external light is transmitted, a driving circuit unit DC disposed in the first region 200 and including at least one TFT T1 and at least one capacitor (not shown), a wire area WA including a third region 300 adjacent to the first region 100 and a fourth region 400 adjacent to the second region 200 and in which at least one wire 348 for transferring a signal to the driving circuit unit DC is disposed, a first electrode 350 disposed in the first region 100 and electrically connected to the driving circuit unit DC, a pixel defining layer 321 disposed at least in the first region 100 and including a first opening 321a exposing a portion of the first electrode 350 and a second opening 321b corresponding to the second region 200, a second electrode 370 disposed at least in the first region 100 and opposite to the first electrode 350, and an intermediate layer disposed between the first electrode 350 and the second electrode 370 and including an organic emission layer 362, and an insulating structure IS disposed between the substrate 10 and the pixel defining layer 321 and including at least one insulating layer 315 and a third opening 315a corresponding to the second region 200 and the fourth region 400.

A first insulating layer 313, the second insulating layer 315, and a third insulating layer 317 may respectively include an eighth opening 313a, a third opening 315a, and a fourth opening 317a, which correspond to the second region 200 and the fourth region 400 of the wire area WA. A buffer layer 311 and the first insulating layer 313 may each be a single layer formed of $SiO_2$. One of the second insulating layer 315 and the third insulating layer 317 may be a single layer formed of $SiO_2$, and the other insulating layer may be a single layer formed of SiNx. The eighth opening 313a, the third opening 315a, and the fourth opening 317a may be simultaneously formed by the same etching process, and thus may each include the same etched surface.

A via insulating layer 320 may be disposed on the third insulating layer 317, and the pixel defining layer 321 may be disposed on the via insulating layer 320. The via insulating layer 320 may include a sixth opening 320a, and the pixel defining layer 321 may include a second opening 321b. The via insulating layer 320 and the pixel defining layer 321 may each be formed of an organic material and may be simultaneously formed by the same etching process.

A driving TFT T1 may be disposed in the first region 100 on the substrate 10. The driving TFT T1 may include an active layer 332, which is a portion of an active pattern, a gate electrode 334, which is a portion of a first conductive pattern, a source electrode 338S, which is a portion of a third conductive pattern, and a drain electrode 338D, which is a portion of the third conductive pattern. The wire 348 may be a data line or a power line and may be disposed on the same layer as the source electrode 338S and the drain electrode 338D. The wire 348 may be formed of the same material as that of the source electrode 338S and the drain electrode 338D.

The via insulating layer 320 may be disposed on the source electrode 338S and the drain electrode 338D. The first electrode 350 which is electrically connected to the drain electrode 338D through a via hole VIA included in the via insulating layer 320, the second electrode 370 opposite to the first electrode 350, and the intermediate layer, which is disposed between the first electrode 350 and the second electrode 370 and includes the organic emission layer 362, may be disposed over the via insulating layer 320.

Both edges of the first electrode 350 may be covered by the pixel defining layer 321. The pixel defining layer 321 may include the first opening 321a, which exposes a portion of the first electrode 350, and the second opening 321b corresponding to the second region 200. According to an exemplary embodiment, the pixel defining layer 321 may be formed of an organic material such as polyimide (PI) and/or the like and may further include a black pigment.

The first electrode 350 may include a transparent conductive layer and a semi-transmissive layer. Here, the transparent conductive layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO), and the semi-transmissive layer may be formed as a thin layer having several nm to several tens nm and may include at least one material selected from the group consisting of Ag, Mg, Al, Pt, Pd, Au, Ni, Nd, Ir, Cr, Li, Ca, and Yb.

The second electrode 370 may be configured as a reflective electrode and may include at least one material selected from the group consisting of Ag, Al, Mg, Li, Ca, Cu, LiF/Ca, LiF/Al, MgAg, and CaAg. The second electrode 370 may include a seventh opening 370a disposed in the second region 200.

The organic emission layer 362 may be disposed between the first electrode 350 and the second electrode 370. Although not shown, in addition to the organic emission layer 362, at least one of an HIL, an HTL, an ETL, and an EIL, which are disposed in each of all pixels in common, may be further disposed between the first electrode 350 and the second electrode 370.

The organic light-emitting display apparatus 3 according to another exemplary embodiment may be a bottom emission type in which the first electrode 350 is a transparent or semitransparent electrode and the second electrode 370 is a reflective electrode. The driving circuit unit DC may be disposed not to overlap the first electrode 350 so that light emitted from the organic emission layer 362 is not obstructed by devices included in the driving circuit unit DC, in plan view.

The first insulating layer 313, the second insulating layer 315, the third insulating layer 317, the via insulating layer 320, and the pixel defining layer 321 may respectively include a plurality of openings 313a, 315a, 317a, 320a and 321b disposed in the second region 200. The openings 313a, 315a and 317a respectively included in the first insulating layer 313, the second insulating layer 315, and the third insulating layer 317 may extend from the second region 200 to the fourth region 400 of the wire area WA. The openings 320a and 321b respectively included in the via insulating layer 320 and the pixel defining layer 321 may be disposed in only the second region 200.

Due to such a configuration, a transmittance of the second region 200 is enhanced, and a process margin is minimized. Accordingly, an area of each of the openings 320a and 321b respectively included in the via insulating layer 320 and the pixel defining layer 321 is enlarged.

As described above, in the organic light-emitting display apparatus 1 (2 and 3) according to the exemplary embodiments, refraction and reflection are prevented from occurring in an interface between insulating layers that have different refractive indexes and are disposed in the second region 200, and an area of the second region 200 is sufficiently secured, thereby improving a transmittance.

As described above, according to the exemplary embodiments, provided is a see-through organic light-emitting display apparatus in which refraction and reflection are prevented from occurring in an interface between a plurality of insulating layers that have different refractive indexes and are disposed in a transmissive region, and an area of the transmissive region is sufficiently secured, thereby enhancing a transmittance.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, those of ordinary skill in the art would understand that various changes in form and details may be made therein without departing from the spirit and scope as defined by the following claims.

What is claimed is:

1. An organic light-emitting display apparatus comprising:
    a substrate;
    a pixel disposed on the substrate, the pixel including a first region configured to realize an image and a second region configured to transmit external light therethrough;
    a driving circuit unit disposed in the first region, the driving circuit unit including at least one thin film transistor (TFT) and at least one capacitor;
    a wire area including a third region adjacent to the first region and a fourth region adjacent to the second region, at least one wire configured to transfer a signal to the driving circuit unit being disposed in the wire area;
    a first electrode disposed in the first region and electrically connected to the driving circuit unit;
    a pixel defining layer disposed at least in the first region, the pixel defining layer including a first opening exposing a portion of the first electrode and a second opening corresponding to the second region;
    a second electrode disposed at least in the first region to be opposite to the first electrode;
    an intermediate layer disposed between the first electrode and the second electrode, the intermediate layer including an organic emission layer; and
    an insulating structure disposed between the substrate and the pixel defining layer, the insulating structure including at least one insulating layer that includes a third opening corresponding to the second region and the fourth region,
    wherein the at least one wire is a data line configured to transfer a data signal to the driving circuit unit.

2. The organic light-emitting display apparatus of claim 1, wherein an area of the third opening is larger than an area of the second opening.

3. The organic light-emitting display apparatus of claim 1, wherein the insulating structure comprises:
    a first insulating layer and a third insulating layer each having a first refractive index; and
    a second insulating layer disposed between the first insulating layer and the third insulating layer, the second insulating layer having a second refractive index different from the first refractive index, and
    the second insulating layer comprises the third opening.

4. The organic light-emitting display apparatus of claim 3, wherein
    each of the first insulating layer and the third insulating layer is formed of a single layer including silicon oxide ($SiO_2$), and
    the second insulating layer is formed of a single layer including silicon nitride (SiNx).

5. The organic light-emitting display apparatus of claim 3, wherein the driving circuit unit comprises:
    an active pattern disposed on the substrate, the active pattern including an active layer of the at least one TFT;
    a first conductive pattern disposed on the active pattern to be insulated from the active pattern, the first conductive pattern including a gate electrode of the at least one TFT;
    a second conductive pattern disposed on the first conductive pattern, the second conductive pattern including an upper electrode of the capacitor; and
    a third conductive pattern disposed on the second conductive pattern, the third conductive pattern including the at least one wire.

6. The organic light-emitting display apparatus of claim 5, wherein
    the first insulating layer is disposed between the active pattern and the first conductive pattern,
    the second insulating layer is disposed between the first conductive pattern and the second conductive pattern, and
    the third insulating layer is disposed between the second conductive pattern and the third conductive pattern.

7. The organic light-emitting display apparatus of claim 5, wherein the upper electrode is disposed to overlap the gate electrode in plan view.

8. The organic light-emitting display apparatus of claim 5, wherein the third conductive pattern including the at least one wire has a thickness of about 5,000 Å to about 7,000 Å.

9. The organic light-emitting display apparatus of claim 5, further comprising:
    a fourth insulating layer disposed on the third insulating layer between the second conductive pattern and the third conductive pattern, the fourth insulating layer including an inorganic material; and
    a via insulating layer covering the third conductive pattern, the via insulating layer including an organic material.

10. The organic light-emitting display apparatus of claim 9, wherein
    the third insulating layer comprises a fourth opening corresponding to the second region and the fourth region,
    the fourth insulating layer comprises a fifth opening corresponding to the second region and the fourth region, and
    the via insulating layer comprises a sixth opening corresponding to the second region.

11. The organic light-emitting display apparatus of claim 10, wherein
    an etching surface of the third opening, an etching surface of the fourth opening, and an etching surface of the fifth opening are connected to each other without a step, and
    an etching surface of the second opening is connected to an etching surface of the sixth opening without a step.

12. The organic light-emitting display apparatus of claim 1, wherein
    the pixel comprises a plurality of pixels including a first pixel and a second pixel adjacent to each other along a first direction,
    the wire area corresponds to a region between the first pixel and the second pixel, and
    the at least one wire comprises a data line extending along a second direction crossing the first direction.

13. The organic light-emitting display apparatus of claim 12, wherein the third opening is connected to the first pixel and the second pixel along the first direction.

14. The organic light-emitting display apparatus of claim 12, wherein each of the first and second pixels comprises a first subpixel, a second subpixel, and a third subpixel that are disposed in the first region, and the first subpixel, the second subpixel, and the third subpixel respectively emit red light, green light, and blue light.

15. The organic light-emitting display apparatus of claim 12, wherein the third opening overlaps at least a portion of the data line disposed in the wire area and the second opening included in each of the first and second pixels in plan view.

16. The organic light-emitting display apparatus of claim 1, wherein a distance between an etching surface of the second opening and the at least one wire is about 2.5 um to about 3.5 um.

17. The organic light-emitting display apparatus of claim 1, wherein an angle between an etching surface of the third opening and the substrate is about 70 degrees or less.

18. The organic light-emitting display apparatus of claim 1, wherein the second electrode comprises a seventh opening corresponding to the second region.

19. The organic light-emitting display apparatus of claim 1, wherein the intermediate layer further comprises a common layer disposed between the first electrode and the organic emission layer and/or between the organic emission layer and the second electrode, and the common layer is disposed in the first region, the second region, and the wire area.

20. An organic light-emitting display apparatus comprising:

a substrate;

a pixel disposed on the substrate, the pixel including a first region configured to realize an image and a second region configured to transmit external light therethrough;

a driving circuit unit disposed in the first region, the driving circuit unit including at least one thin film transistor (TFT) and at least one capacitor;

a wire area including a third region adjacent to the first region and a fourth region adjacent to the second region, at least one wire configured to transfer a signal to the driving circuit unit being disposed in the wire area; a first electrode disposed in the first region and electrically connected to the driving circuit unit;

a pixel defining layer disposed at least in the first region, the pixel defining layer including a first opening exposing a portion of the first electrode and a second opening corresponding to the second region;

a second electrode disposed at least in the first region to be opposite to the first electrode;

an intermediate layer disposed between the first electrode and the second electrode, the intermediate layer including an organic emission layer; and an insulating structure disposed between the substrate and the pixel defining layer, the insulating structure including at least one insulating layer that includes a third opening corresponding to the second region and the fourth region, wherein the second opening and the at least one wire do not overlap each other in plan view.

* * * * *